United States Patent [19]

Hokuf et al.

[11] Patent Number: 5,429,908
[45] Date of Patent: Jul. 4, 1995

[54] EXPOSURE METHOD FOR REDUCING DISTORTION IN MODELS PRODUCED THROUGH SOLID IMAGING BY FORMING A NON-CONTINUOUS IMAGE OF A PATTERN WHICH IS THEN IMAGED TO FORM A CONTINUOUS HARDENED IMAGE OF THE PATTERN

[75] Inventors: Bronson R. Hokuf, Rising Sun, Md.; John A. Lawton, Landenberg, Pa.

[73] Assignee: E. I. Du Pont de Nemours and Company, Wilmington, Del.

[21] Appl. No.: 46,070

[22] Filed: Apr. 12, 1993

[51] Int. Cl.⁶ .................................. G03C 9/08
[52] U.S. Cl. ........................... 430/269; 430/320; 430/394; 425/174.4; 264/22; 156/58; 427/581
[58] Field of Search .............. 430/320, 321, 270, 269, 430/394; 427/54.1; 264/22; 365/119; 364/522; 156/58; 425/174, 174.4, 162

[56] References Cited

U.S. PATENT DOCUMENTS

| | | |
|---|---|---|
| 4,575,330 | 3/1986 | Hull .................................. 425/174.4 |
| 4,752,498 | 6/1988 | Fudim ................................ 427/54.1 |
| 4,945,032 | 7/1990 | Murphy et al. ...................... 430/394 |
| 4,961,154 | 10/1990 | Pomerantz et al. .................. 364/522 |
| 5,002,855 | 3/1991 | Fan et al. ........................... 430/270 |
| 5,006,364 | 4/1991 | Fan .................................... 427/44 |
| 5,014,207 | 5/1991 | Lawton .............................. 364/468 |
| 5,031,120 | 7/1991 | Pomerantz et al. .................. 364/522 |
| 5,051,334 | 9/1991 | Fan .................................... 430/270 |
| 5,094,935 | 3/1992 | Vassiliou et al. ..................... 430/320 |
| 5,104,592 | 4/1992 | Hull et al. ........................... 264/22 |

FOREIGN PATENT DOCUMENTS

| | | |
|---|---|---|
| 0388129 | 12/1990 | European Pat. Off. |
| 2567668 | 7/1984 | France . |
| 145016 | 12/1986 | Japan . |
| 232026 | 3/1988 | Japan . |
| 24123 | 7/1988 | Japan . |
| 2113925 | 10/1988 | Japan . |
| WO9220505 | 5/1992 | WIPO . |

OTHER PUBLICATIONS

Jacobs, Paul F., Ph.D., Rapid Prototyping & Manufacturing, *Fundamentals of Stereolithography*, Soc. Manuftrg Engrs., (1992), pp. 197–219.

*Primary Examiner*—Charles L. Bowers, Jr.
*Assistant Examiner*—John S. Chu
*Attorney, Agent, or Firm*—Thomas H. Magee

[57] ABSTRACT

A method for reducing curl in three dimensional computer generated models, created by the sequential exposure of adjacent layers of a photoformable composition, comprising exposing each layer twice, the first exposure being with an image modulated exposure further modulated to produce a series of isolated, anchored islets along the imaged areas, and the second exposure also being image modulated but without the additional modulation, so as to fuse the islets into a continuous solid image.

12 Claims, 3 Drawing Sheets

EXPOSURE METHOD FOR REDUCING DISTORTION IN MODELS PRODUCED THROUGH SOLID IMAGING BY FORMING A NON-CONTINUOUS IMAGE OF A PATTERN WHICH IS THEN IMAGED TO FORM A CONTINUOUS HARDENED IMAGE OF THE PATTERN

BACKGROUND OF THE INVENTION

1. Field of the Invention

This invention pertains to a method and apparatus for three dimensional modeling and, more particularly, to a method for controlling the exposure of photoformable layers to produce models exhibiting reduced distortion due to internal stresses.

2. Description of Related Art

Many systems for production of three-dimensional (solid) modeling by photoforming are in existence. European Patent Application No. 250,121 filed by Scitex Corporation Ltd., on Jun. 6, 1987, discloses a three-dimensional modeling apparatus using a solidifiable liquid, and provides a good summary of documents pertinent to this art. U.S. Pat. No. 4,575,330 issued Mar. 11, 1986, to C. W. Hull, describes a system for generating three-dimensional objects by creating a cross-sectional pattern of the object to be formed at a selected surface of a fluid medium capable of altering its physical state in response to appropriate stimulation by impinging radiation, particle bombardment or chemical reaction. Successive adjacent laminas adhering to each other, representing corresponding successive adjacent cross-sections of the object, are formed resulting in a three-dimensional object. U.S. Pat. No. 4,752,498 issued Jun. 21, 1988, to E. V. Fudim, describes an improved method of forming three-dimensional objects, which comprises irradiating an uncured photopolymer by transmitting an effective amount of photopolymer solidifying radiation through a radiation transmitting material in contact with the uncured photopolymer. The transmitting material is one that leaves the irradiated surface capable of further cross-linking, so that a subsequently formed layer will adhere thereto.

In generating a three-dimensional object using successive layer hardening by exposure to an imagewise modulated hardening radiation to form successive cross-sections of the object, it is important to assure that each layer accurately represents the desired cross-section of the object, so as to generate a three-dimensional object which is an accurate representation of the desired object. Therefore, it is important that there be no distortion introduced in the creation of each layer which will result in a distorted object. Unfortunately, distortions in the individual layers do occur as the photoformable composition changes during the irradiation process from a substantially freely flowing state to a substantially hardened solid state, due to stresses in the layers. Such stresses are believed to be the result of substantial forces generated during molecular shrinkage as a result of the hardening irradiation process. Numerous solutions to this problem have been proposed.

One solution involves exposing the layers to a WEAVE pattern, discussed in Chapter 8, *Advanced Part Building*, pages 195–219, "RAPID PHOTOTYPING & MANUFACTURING, Fundamentals Of Stereo Lithography" First Edition, by Paul F. Jacobs, Published by The Society of Manufacturing Engineers, One SME drive, P.O. Box 930, Dearborn, Mich. 48121-0930. U.S. Pat. No. 4,945,032 issued Jul. 31, 1990, to Murphy et al., proposes a process for the reduction of distortions whereby the exposure of a layer is stopped and then repeated at least once. Japanese Patent application 63[1988]-172685, published Jan. 26, 1990, also uses two exposures, a first imagewise exposure which leaves only partially cured resin in the exposed areas and, after the model is completed, a second overall exposure which hardens the partially cured resin to produce a solid model. While these methods may reduce distortion, there is still need for a method that will result in an undistorted solid model, having minimal uncured material trapped in its body and maximum hardness.

SUMMARY OF THE INVENTION

The present invention comprises a method for fabricating a three dimensional object from a multiplicity of cross sectional portions of the object. The cross-sectional portions correspond to solidified portions of contiguous layers of a photoformable composition created by the sequential imagewise exposure of the layers. Each layer is exposed in accordance with a predetermined pattern representing a desired cross section of the three dimensional object. Using terminology defined herein below, the present invention comprises:

(1) imagewise exposing at least one layer to the predetermined pattern for the one layer using an exposure source supermodulated to produce on the one layer a noncontinuous image of the pattern having discreet, anchored, hardened image areas separated by image areas of partially hardened photoformable composition; and (2) repeating the imagewise exposure of the one layer to the same predetermined pattern for the one layer using the exposure source modulated to produce on the one layer a continuous hardened image of the pattern.

It is also within the scope of the present invention to effect the imagewise exposure in step (1) above in a manner to produce dash-shaped hardened areas, and wherein the dash-shaped areas along one image line are laterally displaced from the dash-shaped areas in adjacent image lines. The exposure source preferably comprises a scanned laser beam submodulated with a pulse signal to control the exposure of the photoformable composition; both the modulation and the supermodulation of the beam for the two exposures are accomplished by selectively varying the intensity of the beam impinging on the one layer from an "on" state to an "off" state at predetermined time intervals. In generating a solid model, steps (1) and (2) are repeated a preselected number of times to expose a plurality of layers to the corresponding predetermined patterns.

DETAILED DESCRIPTION OF THE PREFERRED EMBODIMENTS

Figure 1:
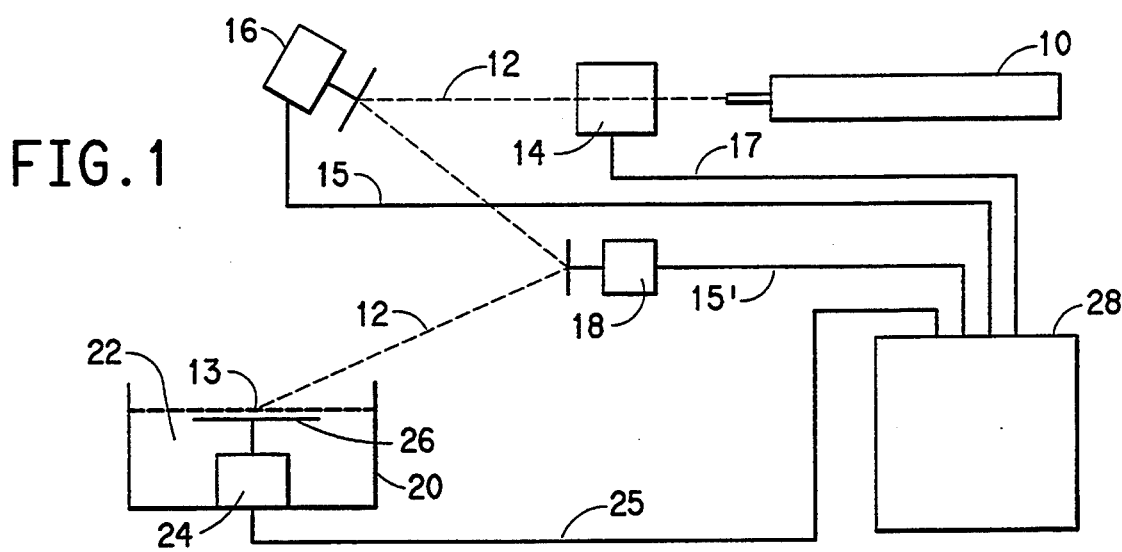
FIG. 1 is a schematic view showing an apparatus used in the practice of this invention.

In describing the creation of a three-dimensional model and improvements to the process in accordance with the present invention, wherein models exhibiting reduced distortion are obtained, certain terms will be used which for clarity are defined herein as follows:

Photoformable composition: A material which is originally in an unhardened, readily deformable state, such as a liquid state, and which becomes hardened or partially hardened upon exposure to a sufficient amount of an appropriate radiation.

Unhardened: The state of the photoformable composition prior to any substantial exposure to radiation, where such composition is in a readily deformable state.

Partially hardened: The state of the photoformable composition after it has been exposed to hardening radiation at a level of intensity insufficient to harden the composition beyond a point where it remains deformable. A flexible, compliant, rubbery state.

Hardened: The state of the photoformable composition after it has been exposed to hardening radiation at a level of intensity sufficient to render the composition solid. (Some unhardened or partially hardened material may be trapped within lattices in the hardened composition, however such material is not present in sufficient quantities to render the material compliant.)

"On" and "Off" states: "On" state is a condition where the intensity and velocity of an exposing radiation beam are such that the Exposure (Intensity of incident radiation * duration of incidence), measured on the image plane, is above a threshold level sufficient to harden the photoformable material. "Off" state is a condition where the beam intensity and velocity are such that the Exposure, similarly measured on the image plane, is below the threshold level sufficient to harden the photoformable material.

Submodulation: A process whereby a laser beam intensity and/or velocity is varied to produce "on" and "off" states with a pulse train of variable pulse width and repetition rate. The pulse width and repetition rate (frequency) are a function of the instantaneous scanning speed of the beam on an image plane. The pulse width and repetition rate are selected to provide substantially uniform exposure levels on the image plane throughout the full scanning path of the beam.

Modulation: A process whereby a laser beam impinging on an image plane is imagewise modulated by varying the beam intensity on the image plane between "on" or "off" states, based on a signal representing image information, to expose areas on the image plane to reproduce an image corresponding to the image information in the signal. The beam may be a submodulated laser beam.

Supermodulation: A process whereby the exposure level generated by a light beam on an image plane is further varied between "on" or "off" states in accordance with a preselected control signal selected to create an interrupted series of exposures which produce a pattern of discreet, disconnected, exposed regions within an exposed portion of an image area on an image plane. This may be accomplished by varying either the intensity of the exposing radiation incident on the image plane or by varying the time the radiation impinges on a point on the image plane or both.

Throughout the following detailed description, similar reference characters refer to similar elements in all figures of the drawings.

FIG. 1 shows an apparatus for practicing this invention. The apparatus comprises a source of exposing radiation, such as a laser 10 which produces an exposing beam 12 of radiation. The laser 10 is preferably a high power laser which may have major bands in the visible, infrared, or ultraviolet regions of the radiation spectrum, the particular band choice being a function of the spectral sensitivity of the composition to be hardened from exposure to the radiation. The term "high power" is a relative term and depends to a great degree on the amount of radiant energy needed to harden a particular photoformable composition (i.e., the photospeed of the composition). With presently available photospeeds, "high power" is considered to be a power greater than 20 mW, and preferably over 100 mW as measured from the intensity of the beam 12. Focussing means, which focus the beam 12 onto an image plane 13, are available but omitted from FIG. 1 for the sake of clarity.

Figure 3:
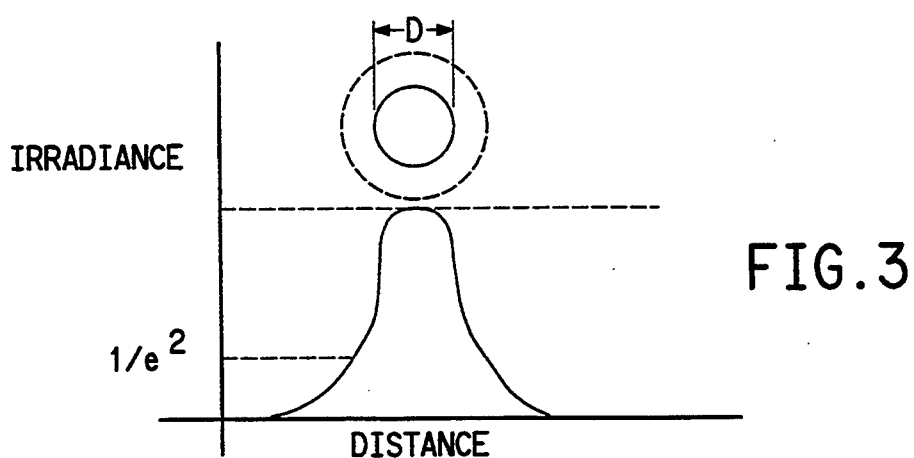
FIG. 3 is a graph showing a beam intensity profile at the target plane.

In addition to a laser generated exposure beam 12, other sources of radiation may be used, such as Electron beams, X-rays, etc. again dependent on the spectral sensitivity of the hardenable composition that is exposed to such radiation. The beam 12 cross section typically has a generally circular shape with a Gaussian intensity distribution, as shown in FIG. 3, where "D" is the $1/e^2$ irradiance level point.

The beam 12 passes through a modulator 14 which is preferably an acousto-optical modulator. The acousto-optical modulator varies the emerging beam intensity between an "on" state and an "off" state as herein above defined in response to an electronic control signal applied thereto.

The beam is next directed through a beam deflection system which preferably comprises two orthogonal beam deflection devices 16 and 18. Devices 16 and 18 are controlled by a beam deflection control means included in a control module 28, over lines 15 and 15'. The beam deflection system may comprise two mirrors rotating around two orthogonal axes mounted on two servo-controlled motors. The servo motors may be controlled with an electronic signal, such as a series of stepping pulses, to rotate the mirrors to position the beam at any point on the image plane 13, and may scan any shape line on such plane 13. A beam deflection system employing servo motors, useful for practicing this invention, was developed and sold by Greyhawk Systems Inc. of Milpitas, Calif. In the alternative, the mirrors may be mounted on galvanometers such that, by appropriate selection of an applied voltage to each of the two galvanometers, the beam may again be positioned at any point on the image plane 13, and may scan any shape line on such plane 13.

The image plane 13 is located in a vat 20 which contains a radiation hardenable composition 22 and a movable support platform 26. The platform 26 is positioned in the vat 20, relative to the laser beam deflection and modulation arrangement, so as to selectively present to the beam 12 at the image plane 13 photoformable composition 22 supported thereon. Means 24 for raising or lowering the platform 26, in response to a control signal applied to the means 24 over line 25, are provided. The control module 28 includes appropriate raising and lowering control means.

The control module 28 may comprise a computer appropriately programmed to perform the functions of modulating and placing the laser beam on the image plane 13 as well as raising the platform to bring photoformable composition to the image plane 13. The computer must perform these functions using appropriate transducers, however, this is well known technology, not of significance to the present invention.

Coating means, also not shown in FIG. 1 for clarity, are provided to permit formation on the platform 26 (or over an object on the platform) at the image plane 13, a layer of photoformable composition of uniform thickness and smooth surface. Again, such coating means are known in the art and not the subject of this invention.

U.S. Pat. No. 5,006,364 issued Apr. 9, 1991, and U.S. Pat. No. 5,094,935 issued Mar. 10, 1992, both assigned to E. I. du Pont de Nemours and Company, disclose photoformable compositions useful in producing multilayer models using the solid imaging process and equipment similar to the equipment schematically shown in FIG. 1. Preferably, the photoformable composition is a liquid composition comprising:

(a) 45 to 55% of a difunctional acrylated polyurethane oligomer, or a mixture of said oligomers;

(b) 25 to 40% of a polyglycol ester, or a mixture of such esters, of the following formula:

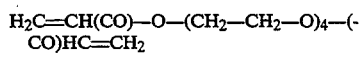

$H_2C=CH(CO)-O-(CH_2-CH_2-O)_4-(-CO)HC=CH_2$ (c) 4 to 6% of a photoinitiator system (or a mixture of photoinitiator systems) sensitive to actinic radiation such as 2,2-dimethoxy-2-phenyl acetophenone; and (d) 10 to 20% of a polyfunctional reactive diluent also such as an acrylate, or a mixture of reactive diluents, and wherein the liquid photoformable composition has a viscosity of 300 to 3000 cP at 25° C.

Figure 2:
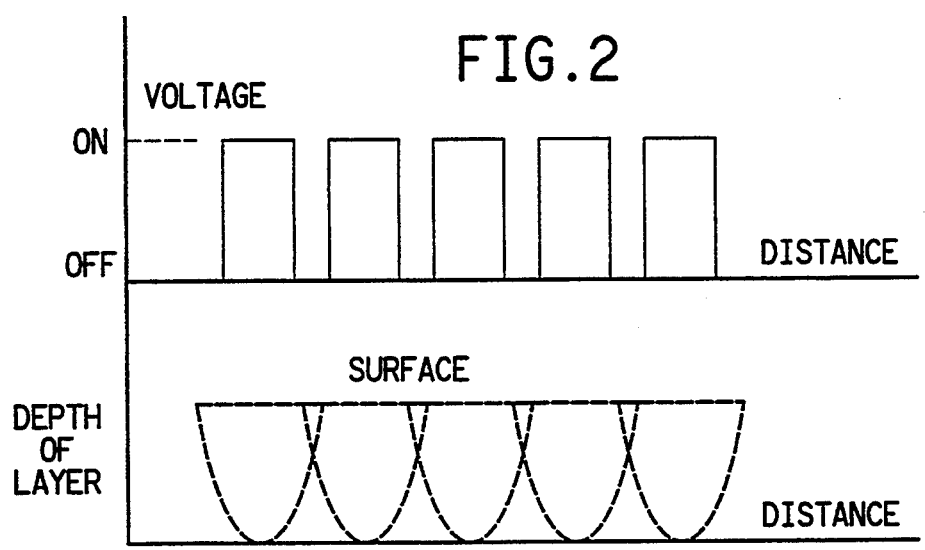
FIG. 2 is a graph showing a control signal which is applied to a radiation beam modulator to submodulate an exposing beam, and the resulting hardening of a photoformable composition exposed by said submodulated beam, under conditions of constant scan velocity.

The beam 12 is modulated in the modulator 14. In the preferred embodiment the beam 12 is modulated three different ways. First, the beam 12 is submodulated by a variable repetition rate pulse train. The pulse occurrence is a function of the angular position of the beam-deflecting, stepper-motor-mounted mirrors, and calculated such that the exposure of the photoformable composition, that is the product of the radiation intensity and the time of application of the radiation at any point along a scanned line on the exposure plane 13, is constant. This is obtained by controlling the pulse repetition rate so that the distribution of exposing pulses on the image plane 13 as a function of distance from start to end, along a scanned line, is regular, as shown in FIG. 2.

Control of the beam 12 in this manner is used to obtain constant exposure along the full length of an exposed image line. Because the beam deflection means do not have zero mass, acceleration and deceleration are not instantaneous, and will affect the exposure if left uncompensated. Thus, a non uniform exposure will result, if no correction is applied, because the scanning speed of the beam 12 is different at the start of each scan, as compared to the steady state along an exposed image line, reached after initial acceleration of the deflecting mirror is completed and operating scanning speed has been reached. The same problem appears at the end of a scanned line, where the mirror decelerates prior to stopping.

In the preferred embodiment, an encoder associated with the stepper-motor-mounted mirrors is used to control the pulse rate of the submodulation signal. The encoder resolution is 1 arc second, and a signal adapted to submodulate the beam 12 on, for a given pulse time width, is generated every 2 arc seconds of mirror rotation. Since the beam 12 is a reflected beam, 2 arc seconds of mirror rotation rotates the beam 4 arc seconds. The radius of scan of the beam 12 from the mirror to the image plane 13 is nominally 51 inches, therefore, a pulse of light will be generated in the image regions approximately every 0.001" (one mil). Because the 1/e2 beam diameter "D" in the current system is approximately 137 μm (5.4 mils), there is substantial overlap of the substantially gaussian submodulated exposures. This overlap is enough to harden a line being exposed such that the line has substantially uniform thickness along its length, as shown in FIG. 2 by the second graph depicting depth of hardening as a function of surface spacing.

Figure 4:
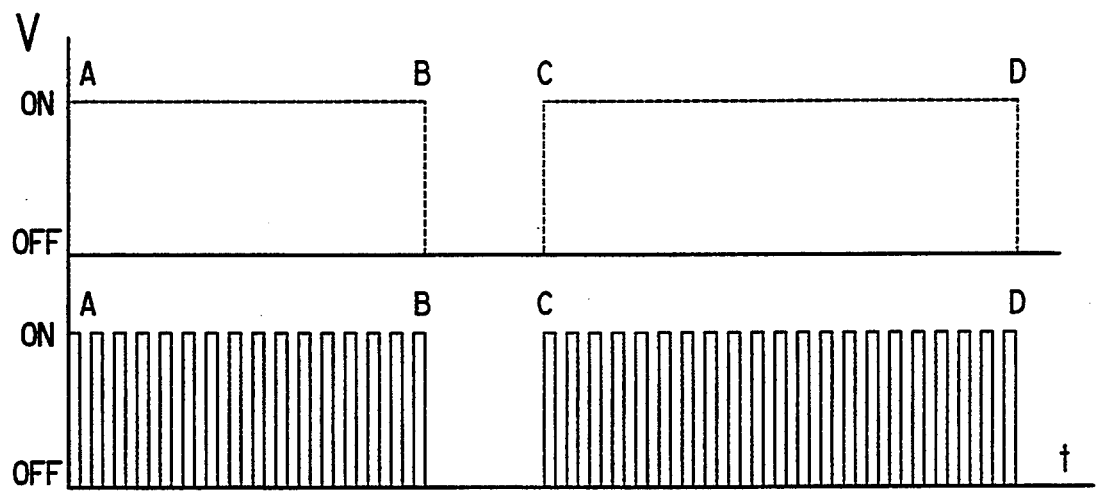
FIG. 4 is a graph showing a control signal which is applied to a radiation beam modulator to imagewise modulate an exposing beam.

A solid object is created by the sequential exposure of a plurality of contiguous overlapping layers, each having been imagewise exposed. The imagewise exposure of each layer is obtained by imagewise exposing photoformable composition at the image plane. This, in turn, is done by imagewise modulating the laser beam. FIG. 4 represents the modulating voltage amplitude "V" as a function of time "t" and illustrates the imagewise modulation of the beam. As shown in FIG. 4, the submodulated beam is further modulated by turning the beam on and off to generate two lines, line A-B (Beam "on") and line C-D, separated by a space B-C (Beam "off"). U.S. Pat. No. 5,014,207 issued May 7, 1991, assigned to E. I. du Pont de Nemours and Company, discusses in more detail this dual modulation exposure process.

In accordance with the present invention, the layers are exposed twice. Preferably, all layers are created by exposing each layer twice. The first exposure is an imagewise exposure with the exposing submodulated radiation beam further modulated with image information and supermodulated with a preselected pulse signal, to produce a noncontinuous image of the pattern having a plurality of anchored, hardened image areas separated by image areas of partially hardened composition, resembling a series of dashes. In the present invention, it is important not only that the image areas between the hardened image areas be partially hardened, but also that the hardened image areas be anchored to the underlying contiguous layer, thereby prevent a "floating" effect during subsequent exposure. We have discovered that distortions in such layers, due to internal stresses during subsequent irradiation, are significantly reduced when the hardened image areas are anchored by this first exposure and, also, when such hardened image areas are separated by partially hardened areas, particularly in overhang regions where "anchoring" is not feasible.

When this first imagewise exposure of the layer is completed, the layer is subjected to a second imagewise exposure, again using an imagewise modulated, submodulated radiation beam, but without the additional supermodulation which created the dashes in the first exposure. The second exposure is calculated to produce a hardened, continuous image. Thus, the image in each layer is produced in two steps, first as a dashed line image, then as a solid image.

Figure 5:
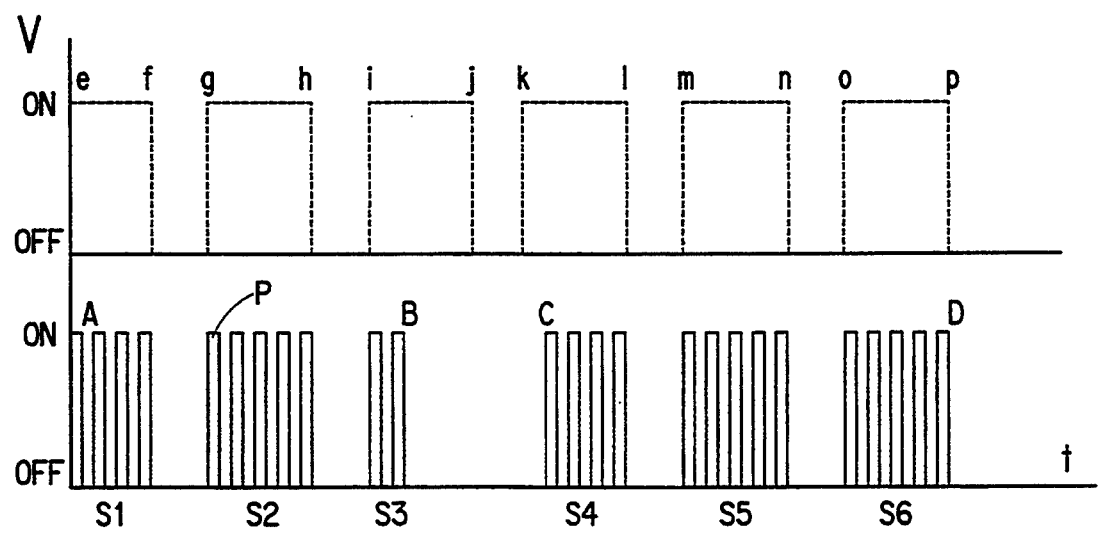
FIG. 5 is a graph showing a control signal which is applied to a radiation beam modulator to supermodulate an exposing beam for use in the first imagewise exposure of a photoformable composition in accordance with this invention.

This process is explained in more detail with reference to FIGS. 4, 5, 6, and 7. The first exposure of a layer is with a beam modulated with a signal as shown in FIG. 5. This signal is the result of three different modulations of the beam. First, there is the submodulation of the signal which generates a series of short pulses P. Superimposed to these pulses, there is a signal representing the image information, i.e., a solid line A-B followed by an unexposed portion B-C, which is in turn followed by another line C-D. Submodulation pulses appear only in the solid line portions.

Figure 6:
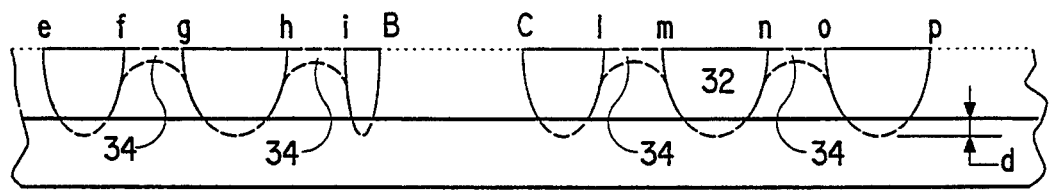
FIG. 6 is a schematic representation of an elevation cross section of the result of the first imagewise exposure of a photoformable layer using the control signal of FIG. 5.
Figure 8:
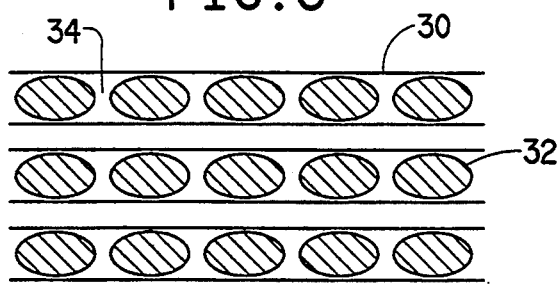
FIG. 8 is a schematic representation of a top view of an exposed image area on a layer showing the islets formed following the first imagewise exposure in accordance with the present invention.

An additional series of supermodulating pulses, e-f, g-h, i-j, etc. is superimposed resulting in an exposing beam comprising the sets S1, S2, S3, S4, S5, and S6, of submodulation pulses P, shown in FIG. 5. The result of the exposure of the hardenable composition to this set of pulses is to generate in the exposed layer at the image plane a series of disconnected hardened areas or islets 32, shaped like dashes along the exposure line 30, separated by areas 34 of partially hardened composition, as shown in FIGS. 6 and 8. In FIG. 8, the hardened islets 32 are shown shaded by a uniform shade. However, it is understood that the degree of hardening is not uniform throughout the islets and, because of the gaussian shape of the exposing beam, there is a fall off on the exposure level near the edges of the islets, which is not shown in the figure. The frequency of the pulse sets must be calculated to assure that there is no hardened material bridging the space between the dashes, the areas 34 between the dashes containing at most only partially hardened composition.

Preferably, the exposure level is calculated to harden the exposed material to a depth extending beyond the thickness of the layer to provide anchoring of the islets in the layer below, by a depth "d" as illustrated in FIG. 6. The size of "d" is not critical, and so long as the exposure will harden material to a depth greater than the layer thickness, such exposure will suffice. The aforementioned U.S. Pat. No. 5,014,207 teaches how to calculate the depth of photohardening as a function of beam irradiance.

Figure 7:
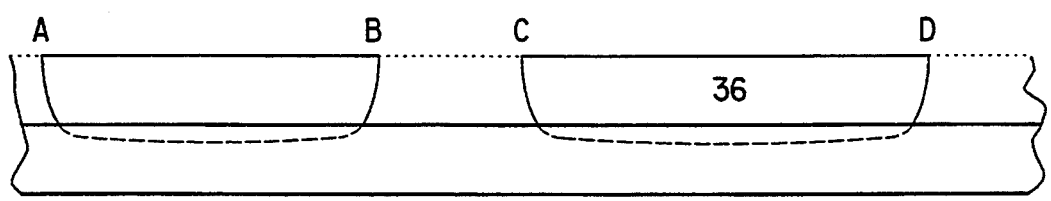
FIG. 7 is a schematic representation of an elevation cross section of the result of the second imagewise exposure of a photoformable layer using the control signal of FIG. 4.
Figure 9:
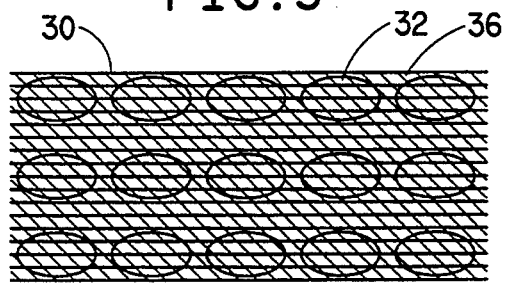
FIG. 9 is a schematic representation of the same area as shown in FIG. 8 following the second imagewise exposure in accordance with this invention.

Following this first exposure, a second exposure of the same layer to the same imaging information is undertaken. The beam intensity is modulated as shown in FIG. 4, resulting in a set of submodulated pulses for the full length of all solid lines, A-B, C-D, etc. The result of this second exposure is to completely harden all exposed areas, bridging the portions between the previously created discontinuous islets or dashes, as shown in FIGS. 7 and 9. FIG. 9 shows a top view of the result of this second exposure where all material along scan lines 36 has been hardened. As shown, the hardened portion includes the islets 32 and the intermediate spaces 34.

Figure 10:
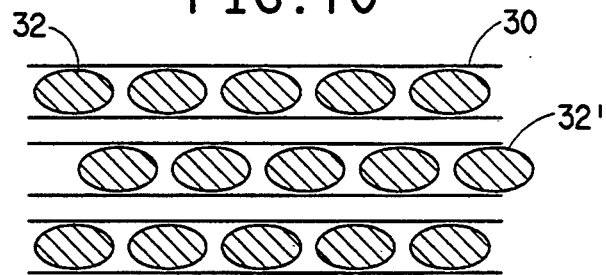
FIG. 10 is a schematic representation of a top view showing the relative location of the islets formed by the first imagewise exposure in accordance with an alternate embodiment of this invention.

FIG. 10 shows a slight variation in this process, whereby the position of the islets 32 in adjacent scan lines 30 is offset so that islets 32 and 32' are not exactly side by side.

It has been observed that in some polymers shrinkage may continue more than a minute after exposure. In cases where such delay is observed, the second exposure, i.e., the exposure with the modulated beam, may be delayed following the exposure with the supermodulated beam by a period of time sufficient to allow for polymer post exposure shrinkage to occur.

After the two imagewise exposures are completed, a new layer of unexposed material is coated over the exposed layer, and the process repeated for this new layer, and so on until a three dimensional object is completed using a plurality of contiguous imaged layers, each imaged layer representing a cross section of the object.

The object is removed from the vat, the unexposed material removed from the object and, if so desired, the object is further hardened by exposing the object to flooding hardening radiation.

In order to save overall exposure time, the scan line spacing for the first exposure scans may be different, i.e., larger, than that of the second, covering the same area in fewer scans. Thus for the first scan, the scan line spacing may be 0.005 inches, while for the second, it may be 0.002 inches resulting in more uniform hardening of the image areas.

As an example, using a liquid photoformable composition such as described hereinabove, and setting each layer to a thickness of 0.005 inches, during the first, supermodulated exposure, the submodulation pulse "P" time width is set at 1.56 sec. A coherent Argon Ion Model 326 laser producing a beam of radiation in the UV spectrum with primary lines of 351.1 nm and 363.8 nm is used as the exposure source to generate an imaging beam having a generally circular cross section generating a circular spot with a Gaussian power distribution at the image plane. The power of the beam in the image plane is 225 mW, and the 1/e2 spot radius is 0.00685 cm. The length of the dash exposure (e-f, g-h, i-k, etc.) is set at 0.004 inches, the space between the dash exposures (f-g, h-i, j-k, etc.) is 0.002 inches, and the dash scan spacing (that is the distance from center to center, between adjacent beam sweeps) is 0.005 inches.

For a 0.002 inch scan spacing and only submodulated exposure, this material has a depth of polymerization to exposure polynomial curve fit of approximately:

$$\text{Depth (cm)} = A + B[ln(\Sigma E)] + C[ln(\Sigma E)]^2$$

where:
A = −0.00314
B = 0.004243
C = 0.001325, and
E = Exposure level in (mJ/cm$^2$).

By summing the adjacent exposures about each point in the image region for a 0.005 inch radius, we can calculate the maximum exposure (at the center of the dash) to be approximately 13.68 mJ/cm$^2$. The maximum thickness (at the center of the dash) is 0.0067 inches. The anchoring or engagement of each dash is therefore 0.0017 inches. The spacing of the dashes is selected so that there is no bridging of hardened material between dashes but only unhardened or partially hardened material exists between dashes.

This first exposure is followed by a second. In the second exposure the beam spot at the image plane is scanned with a 2 mil scan line spacing. The submodulation pulse time width is 0.88 sec. The laser power and laser spot size are unchanged. By summing the exposure, from the first dash scan and the second non-dashed scan, about a point, taking into account contributions of exposure from points within a 5 mil radius, the maximum, minimum, and average exposure is calculated to be 29.04 mJ/cm$^2$, 18.62 mJ/cm$^2$, and 22.71 mJ/cm$^2$, respectively. The resulting maximum, minimum, and average hardened thickness is calculated to be 0.010 inches, 0.008 inches, and 0.009 inches. Since the nominal thickness of the coated layer is 0.005 inches, the material was hardened through its full thickness.

In the above examples and discussion, the invention is described in an environment where a single object is produced by the exposing equipment at a time. It is often the practice in the industry to produce more than one object side by side on the platform in the vat using different imaging information and at times different scan spacings for each. It is also possible to produce multiple objects simultaneously while using different layer thicknesses for the various objects. In all of the above instances the present invention may still be used, and for implementing the invention each object will be considered as existing independently of the others, each being subjected to the two exposures in accordance with the teachings herein.

An illustrative software embodiment used by the present invention is included in an Appendix A to this specification. The software program is written as a UNIX shell script for use in computer 28 or similar signal processor, for generating the first and second exposures, as well as the supermodulation signal which appears immediately before the claims.

The effect obtained by the supermodulated beam was described in terms of supermodulation of the beam using radiation intensity (amplitude) modulation. However, the supermodulation effect can also be achieved by keeping the beam intensity constant and varying the scanning speed of the beam on the image plane. This can be achieved by for instance superimposing a sinusoidal type signal on the scanning mirror driving system, such that the beam oscillates as it moves along a scanning line. This oscillation results in portions on the scanning line receiving longer exposure while others receive shorter exposures. By properly selecting the oscillation frequency, the longer and shorter exposures can be calculated to be above and below an exposure threshold level for the photoformable material used, resulting in hardened and unhardened areas along the scan line.

The system as described above is substantially a digital implementation of the process of this invention. However, the same first and second exposures can be implemented in an analog environment without difficulty. Those skilled in the art having the benefit of the teachings of the present invention as hereinabove set forth, can effect numerous modifications thereto. For instance, one may choose to eliminate the submodulation exposure and use a constant intensity beam modulated only with the imagewise modulation and the supermodulation signals in accordance with the present invention. One may also choose to expose, with the two imagewise exposures as taught herein, selected ones of the layers comprising the solid object rather than each and every layer. These and similar modifications are to be construed as being encompassed within the scope of the present invention as set forth in the appended claims.

What is claimed is:

1. A method for fabricating a three dimensional object from a multiplicity of cross-sectional portions of the object, the cross-sectional portions corresponding to hardened portions of contiguous layers of a photoformable composition created by the sequential imagewise exposure of the layers, each layer being exposed in accordance with a predetermined pattern representing the desired cross-sectional portion of the object, comprising:

(1) imagewise exposing at least one layer to the predetermined pattern for said one layer using an exposure source supermodulated to produce on said one layer a noncontinuous image of said pattern having discreet, anchored, hardened image areas separated by image areas of partially hardened photoformable composition; and (2) repeating the imagewise exposure of the one layer to the same predetermined pattern for said one layer using said exposure source modulated to produce on said one layer a continuous hardened image of said pattern.

2. The method in accordance with claim 1, wherein the exposure source comprises a scanned, submodulated laser beam impinging on the one layer, and the modulation and supermodulation of the exposure source is accomplished by selectively varying the intensity of the beam impinging on said one layer from an "on" state to an "off" state at predetermined time intervals.

3. The method in accordance with claim 1, wherein the exposure source comprises a scanned, submodulated laser beam impinging on the one layer and scanned along a direction, the beam having a scanning speed, and wherein the supermodulation of the exposure source is accomplished by varying the scanning speed of the beam on the layer, along the scanning direction at a predetermined rate.

4. The method according to claim 1 or 2, comprising repeating steps (1) and (2) a preselected number of times to expose a plurality of layers to the corresponding predetermined patterns.

5. The method according to claim 1 or 2 comprising repeating steps (1) and (2) a preselected number of times to expose a plurality of contiguous layers to the corresponding predetermined patterns.

6. The method according to claim 2 wherein the discreet hardened image areas are dot shaped.

7. The method according to claim 2 wherein the discreet, hardened image areas are dash shaped.

8. The method according to claim 1 or 2, wherein the first supermodulated exposure for said one layer produces laterally offset hardened areas on said one layer.

9. The method according to claim 1 wherein the photoformable composition is a photopolymer.

10. The method according to claim 9 wherein the photopolymer is a liquid.

11. The method according to claim 1 wherein there is a time delay between steps (1) and (2).

12. The method according to claim 11 wherein the photoformable composition exhibits continuing shrinkage following exposure, and wherein said time delay between steps (1) and (2) is sufficient to allow shrinkage of the exposed composition to be substantially completed.

* * * * *